United States Patent
Ireland et al.

(10) Patent No.: US 7,660,125 B2
(45) Date of Patent: Feb. 9, 2010

(54) HEAT MANAGEMENT IN CIRCUIT CARD ASSEMBLIES

(75) Inventors: Robert Mowat Ireland, Towcester (GB); John Albert Boocock, Gamilingay Sandy (GB); Graham Charles Kirk, Lilingstone Lovell Buckingham (GB); Michael Arthur Isles, Brackley (GB)

(73) Assignee: Radstone Technology PLC (GB)

( * ) Notice: Subject to any disclaimer, the term of this patent is extended or adjusted under 35 U.S.C. 154(b) by 0 days.

(21) Appl. No.: 11/150,720

(22) Filed: Jun. 10, 2005

(65) Prior Publication Data

US 2005/0281007 A1 Dec. 22, 2005

(30) Foreign Application Priority Data

Jun. 15, 2004 (GB) .................................. 0413420

(51) Int. Cl.
*H05K 7/20* (2006.01)
(52) U.S. Cl. ....................... 361/720; 361/748
(58) Field of Classification Search .................. 361/720, 361/719, 748

See application file for complete search history.

(56) References Cited

U.S. PATENT DOCUMENTS

| | | | | |
|---|---|---|---|---|
| 4,509,096 A | * | 4/1985 | Baldwin et al. | 361/719 |
| 5,172,301 A | * | 12/1992 | Schneider | 361/717 |
| 5,617,294 A | * | 4/1997 | Watson et al. | 361/719 |
| 5,825,625 A | * | 10/1998 | Esterberg et al. | 361/719 |

* cited by examiner

*Primary Examiner*—Hae Moon Hyeon
(74) *Attorney, Agent, or Firm*—GE Global Patent Operation

(57) ABSTRACT

A circuit card assembly (CCA) comprises a printed circuit board (PCB) having first and second opposing major faces with a first pair of elongated edges extending therebetween. Heat management layers are disposed within the CCA and/or PCB, which extend to said edges, and a thermally conductive bar is engaged in a slot provided in each of the elongated edges. Each conductive bar extends over at least the thickness of the PCB, one face preferably being flush with one of the major faces of the PCB and is thermally connected to the heat management layer(s) by thermal connecting means so as to conduct heat from the or each heat management layer to said bar.

14 Claims, 3 Drawing Sheets

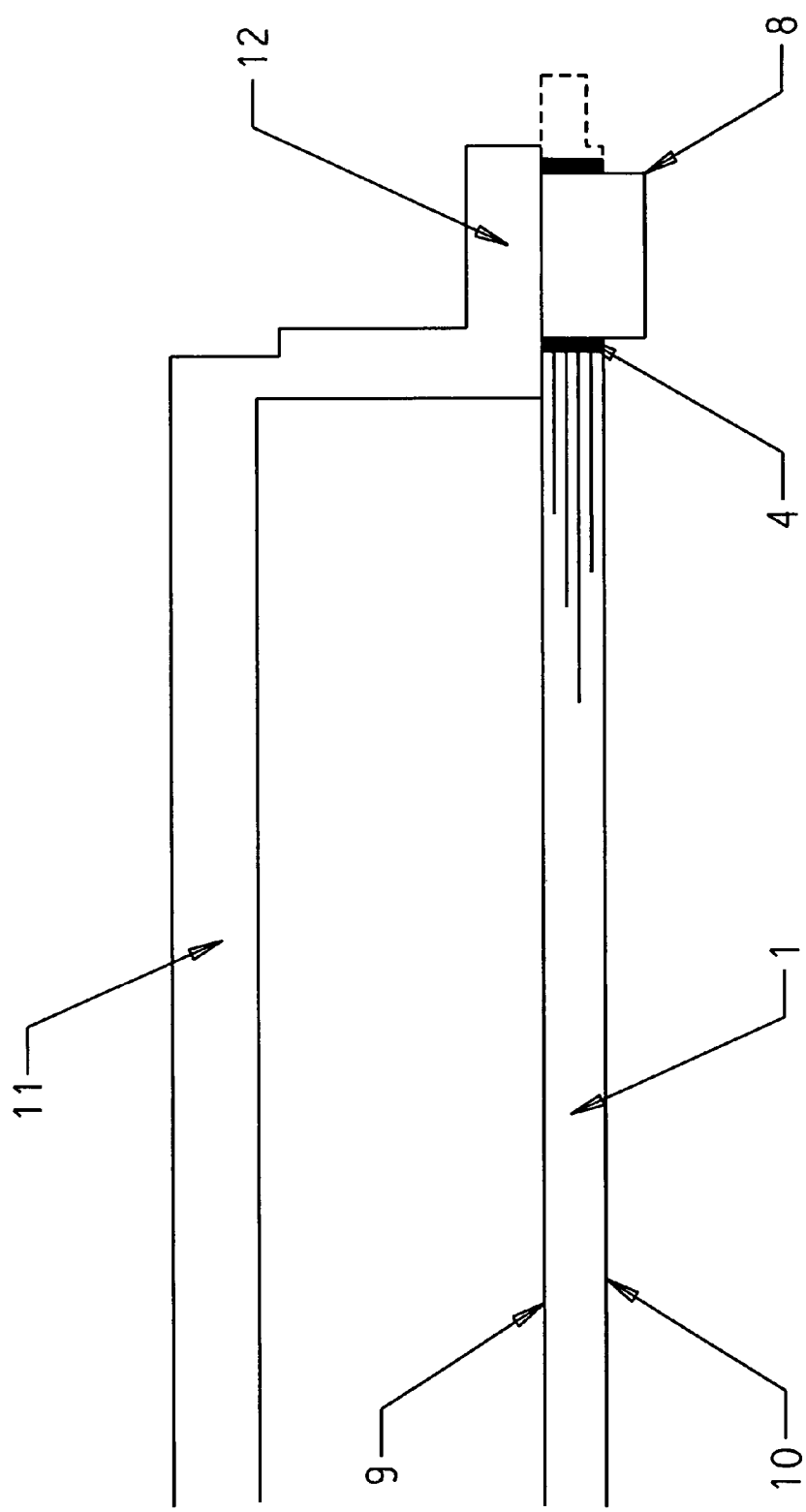

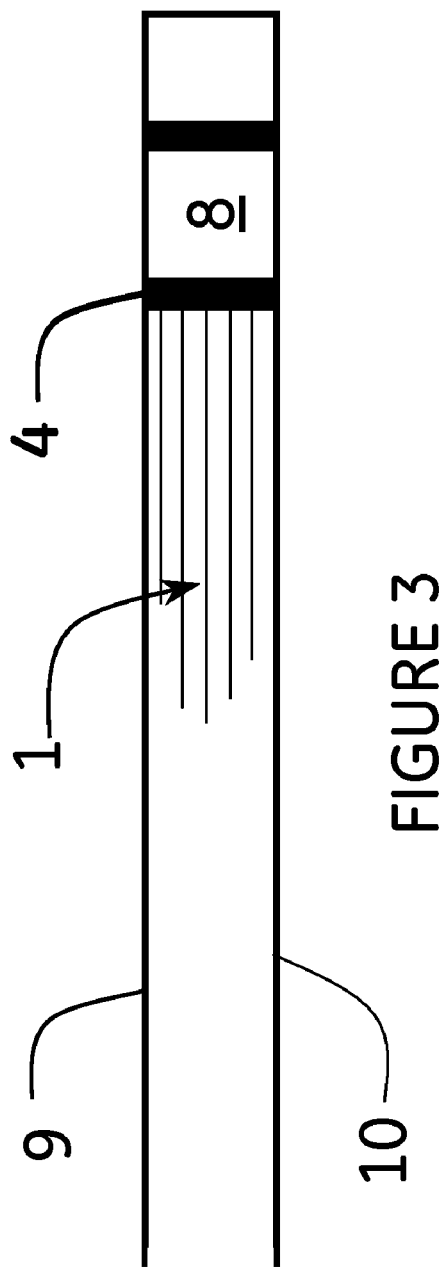
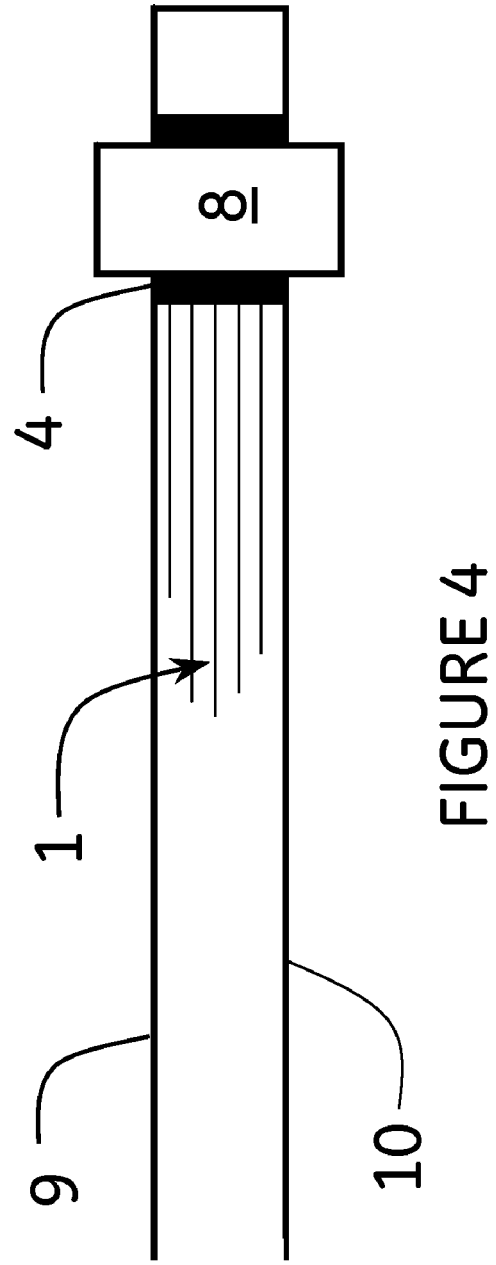

HEAT MANAGEMENT IN CIRCUIT CARD ASSEMBLIES

CROSS-REFERENCE TO RELATED APPLICATIONS

The present application claims priority to British Application No. 0413420.1, titled "Heat Management in Circuit Card Assemblies" filed Jun. 16, 2004.

FIELD OF THE INVENTION

This invention relates to heat management in circuit card assemblies (hereinafter CCAs), and in a preferred embodiment provides a CCA having improved means for removal of heat from heat management layers of the printed circuit board (hereinafter PCB) and the assembly.

BACKGROUND OF THE INVENTION

It is well known in the electronics industry to provide PCBs with heat management layers. A heat management layer consists of a layer of material having a relatively high thermal conductivity incorporated within a CCA and/or PCB to assist removal of heat from the CCA. In typical multi-layer PCBs and CCAs several heat management layers may be provided.

Heretofore, the usual arrangement for removing heat from heat management layers consisted of providing a multiplicity of vias in one or more edge regions of the PCBs, the vias passing through the or each heat management layer. The vias were through-plated with a metal layer which contacted the or each heat management layer and extended through the full thickness of the PCB. One surface of the PCB was provided with a metal surface layer to which a bar was secured by soldering. During the soldering process solder filled the vias and the space between the bar and the metallic layer on the surface of the PCB. The CCA with attached bar was then connected to a suitable heat removal assembly with the bar providing a means of conducting heat from the heat management layers to the heat removal assembly via the through-plating of the vias, the solder filling the vias, the solder between the bar and the PCB, and the bar itself.

SUMMARY OF THE INVENTION

We have now devised an improved CCA arrangement which offers a number of advantages over the prior art as described above.

According to a first aspect of the present invention there is provided a CCA comprising: a PCB having first and second major faces and an elongate edge connecting the major faces; at least one heat management layer within the PCB and/or CCA, the heat management layer extending to said edge; a thermally conductive bar located at said edge and extending over at least the thickness of the PCB; and thermal connecting means thermally connecting the or each heat management layer to the bar at said edge to conduct heat from the or each heat management layer to the bar.

Reference above and hereinafter to PCB is intended to cover printed circuit boards, printed wiring boards and the like.

With such an arrangement the thermally conducting bar is located in the same plane as the PCB rather than being located on the surface of the PCB as in the prior art. The bar desirably is somewhat thicker than the PCB and to this extent projects beyond the surface of the PCB on at least one side thereof. However, the critical characteristic is that the thermally conducting bar extends within the thickness of the PCB whereby the heat management layers can be connected substantially directly to the thermally conducting bar. This contrasts with the prior art in which the heat management layers were connected to the heat management bar(s) by the plating and solder filling the vias provided in the PCB.

The edge may be an edge of a slot formed in the PCB or may be a lateral edge of the PCB.

Preferably, the edge is plated using a suitable thermally conducting material (for example copper, tin, nickel) and the plating material is connected to the thermally conducting bar by a suitable high thermally conducting material, for example solder or a non-metallic thermally conducting compound.

In addition to providing improved removal of heat from the heat management layers the present invention offers a number of additional advantages. In particular, the overall thickness of the CCA, in the zone of the thermally conducting bar, can be determined by the thickness of the thermally conducting bar itself. Since this thickness can be determined to a high degree of accuracy CCAs can be manufactured readily having a known thickness in the region of the thermally conducting bar. This contrasts with the prior art in which the heat management bar is secured to the surface of the PCB by soldering. With such an arrangement, the overall thickness of the CCA in the region of the heat management bar would be the sum of the thickness of the PCB, the thickness of any plating applied to the surface of the PCB, the thickness of any solder between the PCB and the heat management bar, and the thickness of the heat management bar itself. The accumulation of manufacturing tolerances within the various components making up the overall thickness meant that in the prior art unless special steps (such as a pre-milling step to reduce the thickness of the PCB to a known value) was undertaken, the overall thickness of the CCA in the region of the heat management bar was highly variable.

A further advantage of the present invention is that the thermally conducting bar provides a high thermal conductivity connection extending through the entire thickness of the PCB. If a heat sink is provided to remove heat from the bar, or to remove heat directly from components mounted on the CCA, the heat sink can be brought into direct thermal contact with the thermally conducting bar either by clamping the periphery of the heat sink against the thermally conducting bar, or applying a suitable thermally conducting material (for example a high thermal conductivity compound or solder), between the heat sink and the thermally conducting bar. With such an arrangement the CCA and heat sink assembly can be clamped to a heat removal assembly (for example a cooled wall box) by clamping the heat sink and the bar of the CCA against opposing faces provided on the heat removal assembly. Such an arrangement provides highly effective removal of heat from the CCA and heat sink assembly.

BRIEF DESCRIPTION OF THE DRAWINGS

The invention will be better understood from the following description of a preferred embodiment thereof given by way of example only, reference being had to the accompanying drawings wherein:

FIG. 2 is a cross section on a line II-II of FIG. 1;

FIG. 3 is a cross section of a further embodiment of the PCB of FIG. 1 taken along line II-II ; and FIG. 4 is a cross section of a still further embodiment of the PCB of FIG. 1 taken along line II-II.

DETAILED DESCRIPTION OF THE PREFERRED EMBODIMENTS

Figure 1:
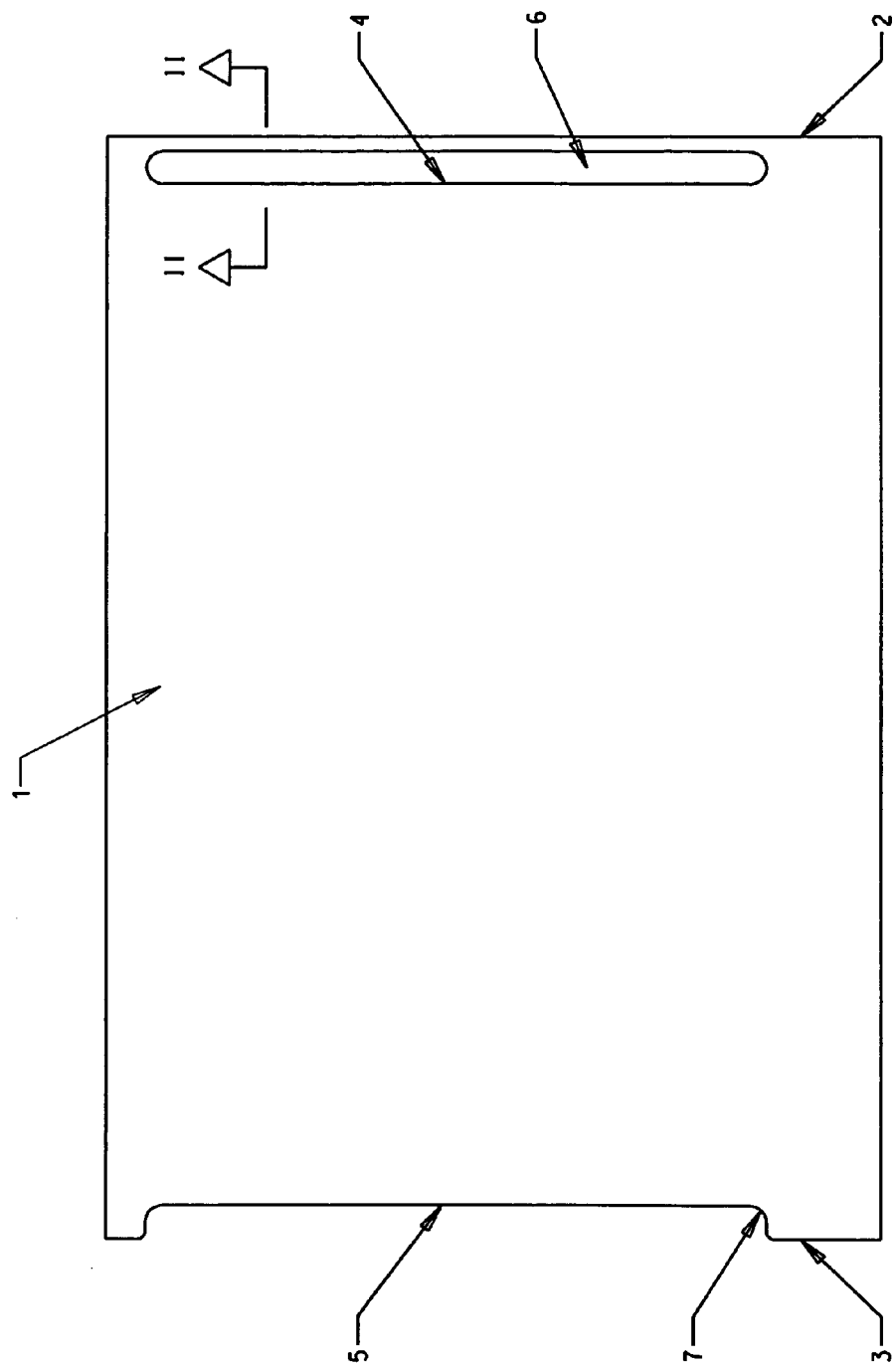
FIG. 1 is a top view of a PCB for use in accordance with the present invention.

Referring firstly to FIG. 1 there is illustrated a multi-layer PCB 1. As will be appreciated by those skilled in the art, in a typical multi-layer PCB at least one, and probably a plurality, of heat management layers are provided within the thickness of the PCB to conduct heat away from the central regions of the PCB towards the edges 2, 3 thereof. As will be appreciated by those skilled in the art, in the prior art the portion of the PCB adjacent to the edges 2, 3 would have been provided with a plurality of drilled vias which would have been through-plated to provide a thermal connection to the heat management layers. The surface of the PCB 1 in the region of the edges 2, 3 would have been provided with a metal layer which was thermally connected to the plating on the vias and a heat management bar would have been soldered to the surface of the PCB with the solder filling the space between the heat management bar and the surface plating, and also infiltrating the plated vias to provide additional thermal conductivity.

In contrast, in the case of the illustrated embodiment of the present invention an edge, 4,5 is provided which connects the illustrated upper face of the PCB to the lower face. In the case of the edge 4, the edge is provided by a slot 6 which is milled through the thickness of the PCB in the region of the edge 2. In the case of the edge 5, the edge is provided by a re-entrant 7 milled into the edge of the PCB 3. In both cases, the edges 4, 5 intercept the heat management layers so that at an edge each heat management layer is exposed at the respective edge 4 or 5. It will be appreciated that in most installations either a milled slot 6 will be provided at both opposite edges of the PCB or a milled re-entrant 7 will be provided at both opposite ends of the PCB. A PCB having one milled slot and one re-entrant is shown merely to illustrate the alternative possibilities for providing an edge as required by the present invention.

Referring now to FIG. 2 a section on the line II-II of FIG. 1 is shown. The edge 4 is preferably metal plated to provide an intimate thermal connection to the exposed edges of the or each heat management layer. A thermally conducting bar 8 is located within the slot 6 and extends from adjacent the upper surface 9 of the PCB 1 downwardly to beyond the lower surface 10 of the PCB 1. The bar 8 is connected to the edge 4 by a suitable thermal attachment material, for example, a solder or a non-metallic thermal attachment material. The effect of this arrangement is to provide a much more direct thermal connection between the heat management layers of the PCB 1 and the thermally conducting bar 8 than was possible in the prior art in which a heat management bar was secured to one of the major surfaces of the PCB.

As illustrated, the PCB 1 is provided with a heat sink 11. The heat sink 11 includes a peripheral flange 12 which is in direct thermal contact with the bar 8. A suitable metallic or non-metallic thermal interface material may be provided between the flange 12 and the bar 8 if desired. The heat sink 11 may be provided either as a means of removing heat from the bar 8 or primarily as a means of removing heat from a component mounted on the CCA. In the latter case, heat will be removed from the entire assembly by clamping the bar 8 and flange 12 between suitable components of a heat removal assembly, for example slots in a cooled box wall. It will be noted that the overall thickness of the assembly in the clamping region is made up substantially entirely of the thickness of the thermally conducting bar 8 and the thickness of the flange 12. The thickness of these components can be well controlled and accordingly relatively low tolerance variations can be expected in the overall thickness of the assembly. This is highly desirable if the assembly is to be used in a close-tolerance assembly. $As further illustrated in FIGS. 3 and 4, the conducting bar 8 can extend beyond both of the major surfaces 9, 10, or it may lie flush within the plane of the PCB 1.

In addition since bar 8 and heat sink 11 can be made of a highly incompressible material, for example a solid metal, much higher clamping forces over a wider temperature range can be maintained between them and the heat removing structure than was possible with the prior art.

The invention claimed is:

1. A circuit card assembly (CCA) comprising:
   a printed circuit board (PCB) having first and second opposing major faces with at least one elongated edge extending therebetween and along at least a portion of a side of said PCB;
   at least one heat management layer within said PCB, said at least one heat management layer extending to said at least one elongated edge, an edge of said at least one heat management layer exposed at said at least one elongated edge along said first and second opposing major faces;
   a thermally conductive bar located at said at least one elongated edge, said thermally conductive bar flush with said first opposing major face and having a thickness that is greater than a thickness of said PCB; and
   a first thermally conducting material connecting said exposed edge of said at least one heat management layer to said thermally conductive bar to facilitate conducting heat away from said at least one heat management layer directly to said thermally conductive bar via said exposed edge and said first thermally conducting material.

2. The CCA according to claim 1, wherein said at least one elongated edge comprises one of a recess and a slot formed therein, and said thermally conductive bar is located within one of said recess and said slot.

3. The CCA according to claim 1, wherein said at least one elongated edge is coated with a second thermally conducting material connecting said thermally conductive bar to said first thermally conducting material.

4. The CCA according to claim 3, wherein said second thermally conducting material comprises one of solder, plated metal, and a non-metallic thermally conducting compound.

5. The CCA according to claim 1, wherein said PCB comprises a pair of opposing elongated edges and said thermally conductive bar comprises a pair of thermally conductive bars, each of said pair of thermally conductive bars positioned with respect to an associated one of said pair of opposing elongated edges.

6. The CCA according to claim 5, wherein said pair of thermally conductive bars are of uniform thickness that is greater than the thickness of said PCB.

7. The CCA according to claim 6, wherein each of said pair of thermally conductive bars is located at the associated elongated edge with said first major face and extending beyond said second major face.

8. The CCA according to claim 6, wherein each of said pair of thermally conductive bars is located at the associated elongated edge such that each of said pair of thermally conductive bars projects beyond said first and second major faces, each of said pair of thermally conductive bars projecting a same distance beyond said first major face.

9. The CCA according to claim 1, wherein said thermally conductive bar extends within a same plane as said PCB.

10. The CCA according to claim 1, further comprising a heat sink in direct thermal contact with said thermally conductive bar.

11. The CCA according to claim 10, wherein a periphery of said heat sink is clamped against said thermally conductive bar.

12. The CCA according to claim 10, wherein a thermal interface material is disposed between said heat sink and said thermally conductive bar.

13. The CCA according to claim 10, wherein said heat sink is integrally formed with said thermally conductive bar.

14. The CCA according to claim 1, wherein said first thermally conducting material comprises one of a copper plating, a tin plating, and a nickel plating.

* * * * *